United States Patent
Shen et al.

(10) Patent No.: US 10,043,851 B1
(45) Date of Patent: Aug. 7, 2018

(54) ETCH SELECTIVITY BY INTRODUCING OXIDANTS TO NOBLE GAS DURING PHYSICAL MAGNETIC TUNNEL JUNCTION (MTJ) ETCHING

(71) Applicant: Headway Technologies, Inc., Milpitas, CA (US)

(72) Inventors: Dongna Shen, San Jose, CA (US); Yu-Jen Wang, San Jose, CA (US)

(73) Assignee: Headway Technologies, Inc., Milpitas, CA (US)

( * ) Notice: Subject to any disclaimer, the term of this patent is extended or adjusted under 35 U.S.C. 154(b) by 0 days.

(21) Appl. No.: 15/668,113

(22) Filed: Aug. 3, 2017

(51) Int. Cl.
  *H01L 43/12* (2006.01)
  *H01L 27/22* (2006.01)
  *H01L 43/08* (2006.01)
  *H01L 43/02* (2006.01)

(52) U.S. Cl.
  CPC ............ *H01L 27/222* (2013.01); *H01L 43/02* (2013.01); *H01L 43/08* (2013.01); *H01L 43/12* (2013.01)

(58) Field of Classification Search
  CPC ....... H01L 27/222; H01L 43/02; H01L 43/08; H01L 43/12
  See application file for complete search history.

(56) References Cited

U.S. PATENT DOCUMENTS

| | | | |
|---|---|---|---|
| 6,395,621 B1 | 5/2002 | Mizushima et al. | |
| 6,806,096 B1 | 10/2004 | Kim et al. | |
| 6,984,529 B2 | 1/2006 | Stojakavic et al. | |
| 7,001,783 B2 | 2/2006 | Costrini et al. | |
| 7,060,194 B2 | 6/2006 | Kodaira et al. | |
| 7,169,654 B2 | 1/2007 | Zia et al. | |
| 7,471,445 B2 | 12/2008 | Pan | |
| 7,593,193 B2 | 9/2009 | Inomata et al. | |
| 7,696,551 B2 | 4/2010 | Xiao et al. | |
| 8,450,119 B2 | 5/2013 | Torng et al. | |
| 8,563,225 B2* | 10/2013 | Assefa | H01L 27/222 430/314 |
| 8,716,072 B2 | 5/2014 | Bangsaruntip et al. | |
| 8,722,543 B2* | 5/2014 | Belen | H01L 43/12 257/295 |

(Continued)

*Primary Examiner* — Allan R Wilson
(74) *Attorney, Agent, or Firm* — Saile Ackerman LLC; Stephen B. Ackerman

(57) ABSTRACT

A process flow for forming magnetic tunnel junction (MTJ) nanopillars with minimal sidewall residue and damage is disclosed wherein a pattern is first formed in a hard mask or uppermost MTJ layer. Thereafter, the hard mask sidewall is etch transferred through the remaining MTJ layers with a RIE process comprising main etch and over etch portions, and a cleaning step. The RIE process features noble gas and an oxidant that is one or more of $CH_3OH$, $C_2H_5OH$, $NH_3$, $N_2O$, $H_2O_2$, $H_2O$, $O_2$, and CO. Noble gas/oxidant flow rate ratio during over etch may be greater than during main etch to avoid chemical damage to MTJ sidewalls. The cleaning step may comprise plasma or ion beam etch with the noble gas and oxidant mixture. Highest values for magnetoresistive ratio and coercivity (Hc) are observed for noble gas/oxidant ratios from 75:25 to 90:10, especially for MTJ nanopillar sizes ≤100 nm.

20 Claims, 3 Drawing Sheets

(56) References Cited

U.S. PATENT DOCUMENTS

| | | | |
|---|---|---|---|
| 8,981,507 B2 * | 3/2015 | Takahashi | H01L 43/12 257/421 |
| 9,166,154 B2 | 10/2015 | Satoh et al. | |
| 9,269,894 B2 | 2/2016 | Mudivarthi et al. | |
| 9,275,713 B2 | 3/2016 | Guo | |
| 9,362,490 B1 | 6/2016 | Xiao | |
| 2003/0073251 A1 | 4/2003 | Ning | |
| 2005/0277207 A1 | 12/2005 | Costrini et al. | |
| 2007/0215911 A1 | 9/2007 | Torng et al. | |
| 2009/0078927 A1 | 3/2009 | Xiao et al. | |
| 2009/0159563 A1 | 6/2009 | Jung | |
| 2009/0261437 A1 | 10/2009 | Kang et al. | |
| 2011/0298070 A1 * | 12/2011 | Fukui | H01L 43/08 257/422 |
| 2013/0248355 A1 * | 9/2013 | Ohsawa | H01L 43/12 204/192.34 |
| 2014/0087483 A1 * | 3/2014 | Ohsawa | H01J 37/08 438/3 |
| 2014/0170774 A1 * | 6/2014 | Mao | H01L 29/66969 438/3 |
| 2014/0235056 A1 | 8/2014 | Guha et al. | |
| 2016/0351798 A1 | 12/2016 | Shen et al. | |
| 2017/0250221 A1 * | 8/2017 | Hayashi | H01L 27/228 |

\* cited by examiner

ETCH SELECTIVITY BY INTRODUCING OXIDANTS TO NOBLE GAS DURING PHYSICAL MAGNETIC TUNNEL JUNCTION (MTJ) ETCHING

RELATED PATENT APPLICATIONS

This application is related to Ser. No. 15/595,484, filing date May 15, 2017; and US Pub. No. 2016/0351798; which are assigned to a common assignee and herein incorporated by reference in their entirety.

TECHNICAL FIELD

The present disclosure relates to an etching process that forms MTJ sidewalls and provides improved etch selectivity of the hard mask relative to underlying MTJ layers, and in particular to a reactive ion etch (RIE) comprised of a noble gas and an oxidant that includes an over etch portion which minimizes bottom electrode redeposition.

BACKGROUND

A MTJ memory element is also referred to as a MTJ nanopillar and is a key component in memory devices such as magnetoresistive random access memory (MRAM) and spin torque transfer (STT)-MRAM. An important step in fabricating an array of MTJ nanopillars is etch transfer of a pattern in an overlying hard mask through a MTJ stack of layers to form an array of MTJ nanopillars with a critical dimension (CD) that in state of the art devices is substantially less than 100 nm from a top-down view. The etch transfer process typically comprises one or more etch steps involving RIE and/or ion beam etch (IBE).

A MTJ stack of layers includes two ferromagnetic layers called the free layer (FL) and reference layer (RL), and a dielectric layer (tunnel barrier) between the FL and RL. The RL has a fixed magnetization preferably in a perpendicular-to-plane direction (perpendicular magnetic anisotropy or PMA) while the FL is free to rotate to a direction that is parallel or anti-parallel to the RL magnetization direction thereby establishing a "0" or "1" memory state for the MTJ. The magnetoresistive ratio is expressed by dR/R where dR is the difference in resistance between the parallel state resistance (Rp) and the anti-parallel state resistance (Rap), and R is the minimum resistance value (Rp).

The bottommost MTJ layer is usually a non-magnetic seed layer that promotes uniform growth in overlying layers, and enhances PMA in the overlying RL or FL. A capping layer (hard mask) such as Ta is generally formed as the uppermost MTJ layer and serves as a protective layer during subsequent physical and chemical etches. An etch process that transfers a pattern in the hard mask through the MTJ stack of layers is challenging since there are a variety of materials (magnetic alloys, non-magnetic metals, and dielectric films) that each have a different etch rate. Although RIE with pure Ar plasma, or IBE cause no chemical damage along MTJ sidewalls, IBE or RIE based only on noble gas has poor etch selectivity between hard mask and MTJ layers such that a hard mask of up to 50% thicker is required than for RIE processes comprising a chemical reactant. Accordingly, formation of high density MTJ arrays with a CD substantially less than 100 nm is difficult because of a high aspect ratio necessary for MTJ nanopillars due to the added hard mask thickness. Moreover, IBE is associated with substantial redeposition of hard mask and bottom electrode metals on MTJ sidewalls. As a result, a shunting path is easily formed on the MTJ sidewalls, which causes shorts and low yields of the memory device.

RIE plasma that is generated from oxidants such as methanol is known to provide MTJ sidewalls substantially free of residue. However, RIE with chemical etchants does cause chemical and plasma damage on MTJ sidewalls. Therefore, improved etch conditions are needed so that redeposition of hard mask and bottom electrode material on MTJ sidewalls is minimized while reducing chemical damage to sidewalls, and exhibiting greater etch selectivity thereby enabling a substantially thinner hard mask thickness and lower aspect ratio, and higher device yields, especially for MTJs with critical dimensions below 100 nm.

SUMMARY

One objective of the present disclosure is to provide a process for etching a MTJ stack of layers using a hard mask so that chemical damage to MTJ sidewalls is substantially minimized compared with conventional RIE methods, and redeposition of etched materials on MTJ sidewalls is reduced compared with IBE.

A second objective of the present disclosure is to provide a MTJ etch process according to the first objective that enables substantially higher etch selectivity between the hard mask and underlying MTJ layers than with pure noble gas IBE such that hard mask thickness is reduced to produce higher DRR, and higher yields for MTJ devices, especially for critical dimensions ≤100 nm.

According to a preferred embodiment, these objectives are achieved by providing a MTJ stack of layers having at least a reference layer, free layer, a tunnel barrier between the free layer and reference layer, and an uppermost hard mask. In some embodiments, a seed layer is employed as the bottommost MTJ layer on a substrate that is a bottom electrode in a memory device. A pattern comprising a plurality of island features with the desired critical dimension for the eventual MTJ nanopillars is first defined in a photoresist mask layer above the hard mask layer. In preferred embodiments, there is a bottom anti-reflective coating (BARC) or a dielectric anti-reflective coating (DARC) between the hard mask and photoresist mask layer that has better resistance to subsequent etch processes than the photoresist mask. The pattern is etch transferred through the BARC or DARC by a first RIE or IBE step, and is then transferred through the hard mask by continuing the first etch step, or by performing a second RIE step comprised of a fluorocarbon or chlorocarbon gas, or by a second IBE step.

According to one embodiment of the present disclosure, the pattern of island features is then transferred through the remaining MTJ layers by a RIE or IBE process comprising a main etch step during a first period of time (t1) wherein plasma or ions that are generated from a noble gas, and one or more oxidants including but not limited to $CH_3OH$, $C_2H_5OH$, $NH_3$, $O_2$, $H_2O_2$, $N_2O$, $H_2O$, $CO$, and $NH_3$ are directed essentially orthogonal to the substrate in RIE or at an angle from 0 to about 90° to the substrate for IBE. In particular, the noble gas ions and plasma provide a physical component while ions and plasma from the one or more oxidants provide a chemical etching component. As a result, the noble gas component substantially minimizes chemical damage to the MTJ sidewalls, and redeposition of etched residue on the MTJ sidewalls is significantly reduced by the chemical component. Moreover, the oxidant enables non-volatile metal residues formed on MTJ sidewalls to be converted to metal oxide that are volatile under certain conditions. In one embodiment where Ar is the noble gas, and methanol is the oxidant, the Ar/methanol flow rate ratio is preferably maintained between 1:1 and 9:1 to yield MTJ nanopillars with minimal sidewall damage and residue. In a RIE chamber with top and bottom electrodes, a first RF power is applied to the top electrode, and a second RF power is applied to the bottom electrode to generate the plasma.

The RIE process also comprises an over etch step in the RIE chamber immediately after the main etch step wherein the plasma based on the noble gas and oxidant is continued for a second period of time (t2) where t2 is typically less than or equal to t1. Although MTJ sidewalls are substantially formed during the main etch, the over etch step is advantageously employed to ensure a more complete removal of MTJ materials between adjacent sidewalls, and of redeposited material on MTJ sidewalls. Furthermore, the noble gas/oxidant flow rate ratio is increased during the over etch step in some embodiments in order to minimize chemical damage to the MTJ sidewalls.

According to a second embodiment of the present disclosure, the RIE process further comprises an IBE or plasma cleaning step after the main etch and over etch steps. When IBE is selected for the cleaning step, the incident angle of the ions may be between 0° to 90° with respect to the substrate thereby including a horizontal component that is beneficial in removing any remaining sidewall residue or damage. Furthermore, one or more oxidants may be added to the noble gas in the IBE chamber to oxidize any metal residue that remains on MTJ sidewalls. With a plasma etch for the cleaning step, a RF power preferably ≤100 Watts is used to generate a plasma from a noble gas or a combination of noble gas and oxidant. In this case, the plasma is directed essentially orthogonal to the substrate. Moreover, the plasma etch may be performed in the same mainframe as a subsequent encapsulation process to avoid exposing clean MTJ sidewalls to oxygen or moisture.

Thereafter, an encapsulation layer is deposited on MTJ nanopillars to fill gaps between adjacent MTJ sidewalls, and then a chemical mechanical polish (CMP) process is performed to remove all layers above the hard mask. The CMP process forms a hard mask top surface that is coplanar with the surrounding encapsulation layer top surface. From a top-down view, the MTJ nanopillars form an array of circular or elliptical shapes, for example. A top electrode layer is then formed on the encapsulation layer and on the plurality of MTJ nanopillars such that each MTJ nanopillar is between a bottom electrode and a top electrode to yield a memory device.

DETAILED DESCRIPTION

Figure 1:
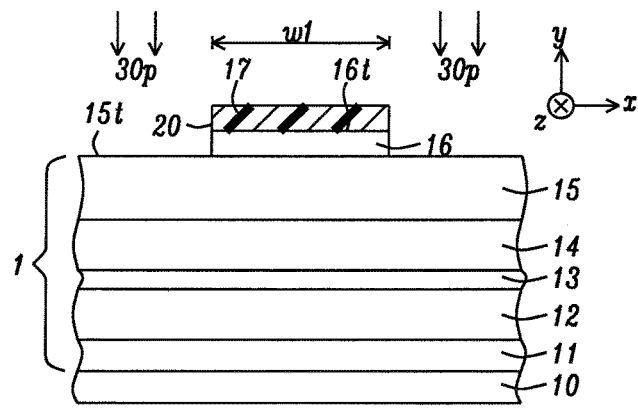
FIG. 1 is a cross-sectional view of a MTJ stack of layers on which a photoresist pattern has been formed, and shows ions used to transfer the pattern through an underlying BARC or DARC during an etch process of the present disclosure.

The present disclosure is a RIE process comprised of both physical and chemical etching components to form a MTJ nanopillar with sidewalls having minimal chemical damage and minimal residue. Only one MTJ nanopillar is depicted in the drawings with cross-sectional views, but one skilled in the art should appreciate that a plurality of MTJ nanopillars is formed in a typical memory device pattern. A process is defined as a method that includes one or more steps. Therefore, an etch process may have a main etch step that terminates at an end point, an over etch step where the main etch conditions are substantially maintained for a certain period beyond the end point, and an IBE or plasma cleaning step which is designed to remove damage or remaining residue from MTJ sidewalls. The resulting MTJ nanopillars may be used in MRAM or STT-MRAM applications.

In related patent application Ser. No. 15/595,484, we disclosed a RIE process in which a plasma generated from a combination of Ar and $CH_3OH$, followed by an IBE sputter clean with Ar was successfully employed to improve dR/R (DRR) for MTJ nanopillars and increase device yields, especially when etching MTJ stacks to form CDs ≤45 nm. Now we have discovered that the RIE process may be further optimized to include an over etch portion, and a high pan angle IBE trimming step (or plasma cleaning step) based on a noble gas/oxidant combination to enhance device performance and yield.

In FIG. 1, a MTJ stack 1 is shown after layers 11-15 are sequentially formed on a substrate 10 that in one embodiment is a bottom electrode in a memory device. The substrate is formed on a sub-structure (not shown) that is fabricated on a wafer as appreciated by those skilled in the art. The bottom electrode may be a multilayer structure comprising conductive metals and alloys such as Ta, TiN, and TaN, and is typically embedded in a dielectric layer (not shown). The y-axis dimension indicates a thickness for each layer, and critical dimensions (length or width) correspond to x-axis and z-axis dimensions in the exemplary embodiments.

In the exemplary embodiment, MTJ stack 1 has a bottom spin valve configuration wherein a seed layer 11, pinned or reference layer 12, tunnel barrier 13, free layer 14, and hard mask 15 are sequentially formed on the substrate. However, the present disclosure also anticipates the MTJ stack may have a top spin valve configuration or dual spin valve configuration that are well known in the art. Each of the reference layer and free layer preferably have PMA with a magnetization aligned in a positive or negative y-axis direction. In other embodiments, at least one additional layer may be included in the aforementioned MTJ stack such as a Hk enhancing layer (i.e. MgO) between the free layer and hard mask that enhances PMA in the free layer. The seed layer may be comprised of one or more of NiCr, Ta, Ru, Ti, TaN, Cu, Mg, or other materials typically employed to promote a smooth and uniform grain structure in overlying layers.

The reference layer 12 may have a synthetic anti-parallel (SyAP) configuration represented by AP2/Ru/AP1 where an anti-ferromagnetic coupling layer made of Ru, Rh, or Ir, for example, is sandwiched between an AP2 magnetic layer and an AP1 magnetic layer (not shown). The AP2 layer, which is also referred to as the outer pinned layer is formed on the seed layer while AP1 is the inner pinned layer and typically contacts the tunnel barrier. AP1 and AP2 layers may be comprised of CoFe, CoFeB, Co, or a combination thereof. In other embodiments, the reference layer may be a laminated stack with inherent PMA such as $(Co/Ni)_n$, $(CoFe/Ni)_n$, $(Co/NiFe)_n$, $(Co/Pt)_n$, $(Co/Pd)_n$, or the like where n is the lamination number. Furthermore, a transitional layer such as CoFeB or Co may be inserted between the uppermost layer in the laminated stack and the tunnel barrier layer.

Tunnel barrier layer 13 is preferably a metal oxide that is one or more of MgO, TiOx, AlTIO, MgZnO, $Al_2O_3$, ZnO, ZrOx, HfOx, or MgTaO. More preferably, MgO is selected as the tunnel barrier layer because it provides the highest magnetoresistive ratio, especially when sandwiched between two CoFeB layers, for example.

The free layer 14 may be Co, Fe, CoFe, or an alloy thereof with one or both of B and Ni, or a multilayer stack comprising a combination of the aforementioned compositions. In another embodiment, the free layer may have a non-magnetic moment diluting layer such as Ta or Mg inserted between two CoFe or CoFeB layers that are ferromagnetically coupled. In an alternative embodiment, the free layer has a SyAP configuration such as FL1/Ru/FL2 where FL1 and FL2 are two magnetic layers that are antiferromagnetically coupled, or is a laminated stack with inherent PMA described previously with respect to the reference layer composition.

The hard mask 15 is also referred to as a capping layer and is typically comprised of one or more of Ta, Ru, TaN, Ti, TiN, and W. It should be understood that other hard mask materials including MnPt may be selected in order to provide high etch selectivity relative to underlying MTJ layers during an etch process that forms MTJ nanopillars with sidewalls that stop on the bottom electrode. All layers in the MTJ stack may be deposited in a DC sputtering chamber of a sputtering system such as an Anelva C-7100 sputter deposition system that includes ultra high vacuum DC magnetron sputter chambers with multiple targets and at least one oxidation chamber. Usually, the sputter deposition process involves argon sputter gas and a base pressure between $5 \times 10^{-8}$ and $5 \times 10^{-9}$ torr.

Prior to the MTJ etch process described herein, the uppermost hard mask 15 is patterned in order to serve as a MTJ etch masking layer. According to one embodiment, a BARC or DARC layer 16, and a photoresist layer 17 are sequentially formed on the top surface 15t of the hard mask by well known methods. BARC or DARC with top surface 16t has a refractive index that minimizes reflection of light during subsequent patternwise exposure thereby enabling more uniform island shapes with less CD variation to be formed in the photoresist layer. A conventional patternwise exposure and developer sequence is employed to form a pattern in the photoresist layer that comprises a plurality of islands each with sidewall 20. As indicated later by a top-down view in FIG. 7, the islands are in an array having a plurality of rows and columns. However, only one island is shown in FIG. 1 in order to simplify the drawing. Each island has a critical dimension w1 that in some embodiments is between 45 nm and 100 nm, and in other embodiments is proximate to 30 nm that corresponds to the CD required in more advanced memory devices. Note that some devices are circular such that w1 is formed in both of the x-axis and z-axis directions. In other embodiments, the top-down shape of island 17 may be an ellipse or a polygon such that the z-axis dimension is different from the x-axis dimension.

After patterning photoresist layer 17, the island shape in photoresist layer 17 is transferred through the BARC or DARC layer 16 with a first etch step that may be an IBE with one or more of Ar, Kr, Xe, or Ne, or may comprise RIE with a fluorocarbon or chlorocarbon gas wherein ions or plasma 30p are directed substantially orthogonal to hard mask top surface 15t. Moreover, oxygen may be flowed into the etch chamber during the IBE or RIE, or afterward as a passivation measure to form a smoother sidewall. As a result, sidewall 20 is extended along the BARC or DARC to a top surface 15t of the hard mask 15, and CD w1 is duplicated in the DARC or BARC layer. The photoresist layer may then be removed with a well known method, or is etched away during subsequent etch processes.

Figure 2:
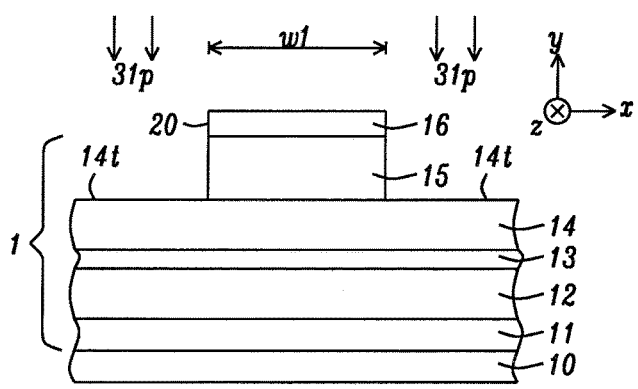
FIG. 2 is a cross-sectional view of a MTJ stack in FIG. 1 after an etch step transfers the pattern through the uppermost hard mask MTJ layer according to an embodiment of the present disclosure.

Referring to FIG. 2, a second etch step is performed to transfer the island shape with sidewall 20 and CD w1 through the hard mask 15. In some embodiments, a second IBE with a noble gas, or a second fluorocarbon or chlorocarbon based RIE may be used wherein ions or plasma 31p are directed substantially orthogonal to free layer top surface 14t. However, in other embodiments, the present disclosure anticipates that the conditions employed for the second etch step are essentially the same as applied in the first etch step such that the etch transfer through the hard mask may be a continuation of the etch transfer through DARC or BARC layer 16. In other words, the first etch with plasma 30 in FIG. 1 may be continued until stopping on top surface 14t. The etch transfer through the hard mask may remove any remaining photoresist layer 17 because the etch rate through the latter is generally high relative to the hard mask, and the hard mask may be substantially thicker than the remaining photoresist layer once the first etch step clears the exposed portions of DARC or BARC layer 16.

In other embodiments, a well known treatment with oxygen, water, or air is used to passivate the hard mask sidewalls before a conventional photoresist strip process is performed. We disclosed a passivation method in related US Pub. No. 2016/0351798.

Figure 3:
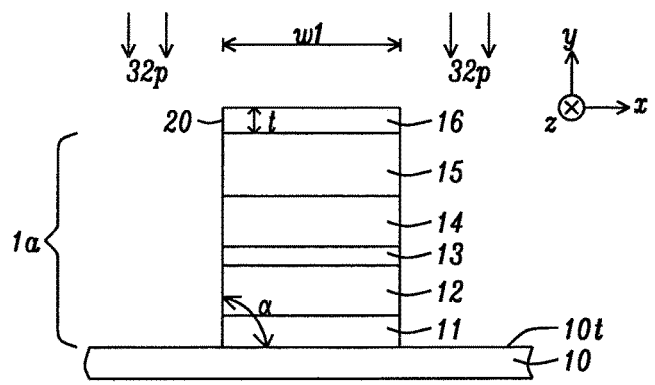
FIG. 3 is cross-sectional view of a MTJ nanopillar after an etch process comprised of a noble gas and oxidant is used to transfer the hard mask pattern through the remaining MTJ stack according to an embodiment described herein.

Referring to FIG. 3, a key feature according to a first embodiment of the present disclosure is a MTJ etch process comprising a main etch step and an over etch step that effectively transfers the island shape in the hard mask 15 through all of the underlying MTJ layers 11-14 thereby forming MTJ nanopillar 1a. The main etch step comprises a physical component that is ions and plasma from a noble gas such as Ar, Kr, Ne, or Xe, and a chemical component made of ions and plasma of a chemical (oxidant) species that are generated with RIE or IBE conditions. Thus, in a RIE embodiment, both of an noble gas and one or more oxidants including methanol, ethanol, $NH_3$, $N_2O$, $H_2O_2$, $H_2O$, $O_2$, and CO are fed into an etch chamber while a plasma is induced with a RF power at a temperature between room temperature and 80° C. The resulting ions and plasma 32p are directed essentially orthogonal to the top surface 10t of the substrate along the y-axis direction in a RIE process. As a result, sidewall 20 is a continuous surface extending from a top surface 15t of hard mask 15 to top surface 10t of the bottom electrode. We have discovered that MTJ etch process disclosed herein provides a higher sidewall angle α compared with IBE or RIE with pure noble gas. For example, RIE with Ar only yields a MTJ sidewall where α is around 65°. However, as oxidant content is increased to 10% with a 9:1 Ar/CH$_3$OH flow rate ratio or further to 50% with a 1:1 Ar/CH$_3$OH flow rate ratio in a RIE process, angle α desirably becomes more vertical and is substantially equal to 75°.

In a RIE process chamber according to the exemplary embodiments, there is an upper electrode, a lower electrode (electrostatic chuck) on which one or more wafers are held in place, and a gap between each wafer and upper electrode (not shown). Preferably, a first RF power between 600 and 3000 Watts is applied to the upper electrode, and a second RF power from 400 to 3000 Watts is applied to the lower electrode in order to generate and sustain plasma in the gap between the two electrodes. In addition, the RIE chamber pressure must be ≤3 mTorr, but is sufficiently high enough to sustain a stable plasma.

The flow rates of the noble gas and oxidant during the etch process comprised of main etch step and a subsequent over etch step with plasma or ions 32p are of sufficient magnitude to sustain the plasma. According to one preferred embodiment, the flow rate ratio of noble gas to oxidant is maintained between 1:1 and 9:1. In general as the flow rate ratio changes from pure noble gas to 9:1, or from 9:1 to 1:1, the increasing amount of oxidant in the plasma slows the etch rate of the hard mask and of each MTJ layer, and results in higher etch rate selectivity between the hard mask and MTJ layers, which is described later with regard to results in FIGS. 8-9. At flow rate ratios below 1:1 where oxidant content is higher than noble gas content, the plasma is rich in oxidant and leads to a greater risk of chemical damage to MTJ sidewalls. With flow rate ratios above 9:1 and approaching pure noble gas, etch rates are substantially increased and result in lower selectivity between a Ta or TaN hard mask and underlying MTJ layers. However, we have found that even with a 98:2 Ar/CH$_3$OH flow rate ratio, etch rate selectivity is considerably increased and sidewall residue is substantially decreased compared with pure Ar etching.

As mentioned earlier, IBE or RIE with 100% noble gas means a thicker hard mask is needed for the MTJ etch which in turn causes a greater aspect ratio (thickness/CD) during the main etch compared with the RIE process of the present disclosure. In other words, IBE or RIE with pure noble gas is considered to have a more pronounced shadow effect in which small gaps between adjacent MTJ sidewalls are more difficult to clean out, especially in locations proximate to the bottom electrode top surface 10t. Accordingly, IBE or RIE involving only noble gas ions and plasma has a greater tendency to remove an upper portion of the bottom electrode made of Ta, TaN, TiN, or other conductive metals or alloys, especially in regions with larger spaces between MTJ sidewalls during an over etch portion of a conventional MTJ etch process.

Those skilled in the art will appreciate that larger spaces (greater x-axis and z-axis dimensions between sidewalls) clear more readily during IBE and RIE than smaller spaces. As a result, the bottom electrode top surface 10t in the larger spaces is exposed to IBE or RIE plasma for a greater length of time than in smaller spaces. In summary, the MTJ etch step comprised of plasma or ions 32p of the present disclosure has a less pronounced shadow effect and therefore mitigates the risk in conventional IBE or RIE based on pure noble gas of removing a significant portion of bottom electrode during the over etch period required to clean small spaces between adjacent MTJ nanopillars.

In a preferred embodiment, sidewall 20 is substantially vertical such that CD w1 is maintained in all MTJ layers 11-15. Moreover, when the noble gas/oxidant flow rate ratio is maintained between 1:1 and 9:1 according to a preferred embodiment, the combined physical and chemical etching provides for a sidewall with minimal sidewall damage and substantially free of residue. In the exemplary embodiment, a thickness t of the DARC or BARC layer remains after etching with plasma or ions 32p. However, depending on the initial thickness and composition of layer 16, and the etch conditions, the DARC or BARC layer may be completely removed during the MTJ etch such that hard mask top surface 15t is exposed. Therefore, a hard mask 15 is advantageously selected that has a high etch rate selectivity to the underlying MTJ layers so that a substantial thickness of hard mask remains after the main etch and over etch with plasma or ions 32p.

Figure 4:
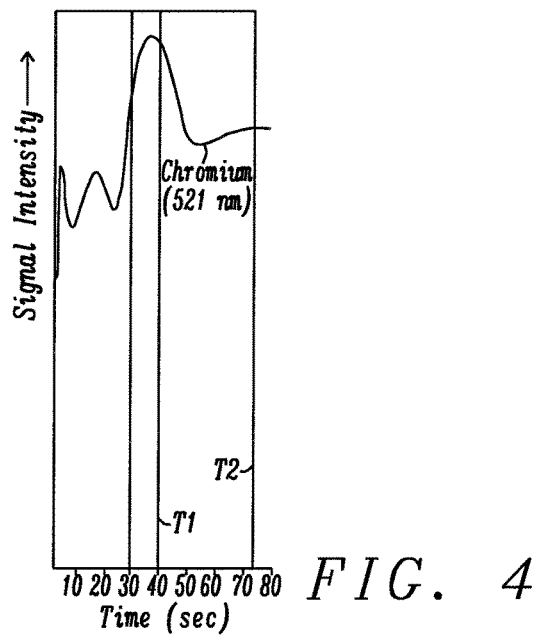
FIG. 4 is a plot of time vs. signal intensity detected by an optical emission spectroscopy (OES) method during the MTJ etch step in FIG. 3.

The MTJ etch step with plasma or ions 32p comprises a main etch portion during a first period of time that ends when an end point is reached. As depicted in FIG. 4, an optical emission spectroscopy system may be employed to monitor the progress of RIE etching in real time. As each MTJ layer is etched, the plasma in the RIE chamber has a particular emission spectrum in the visible range of light. Signal intensity for one or more wavelengths is used to monitor the composition of the plasma. More than one etched MTJ material or etchants in the form of ions and/or molecules may contribute to the total intensity at a given wavelength. In the exemplary embodiment, OES end point is determined by monitoring the signal intensity at 521 nm (corresponding to Cr species from the NiCr seed layer) as a function of time. End point (T1) for the main etch is about 39 seconds for this RIE that comprises a 15 standard cubic centimeters per minute (sccm) methanol flow rate (no noble gas), a RF power of 1500 Watts (upper electrode), 1100 Watts (lower electrode), and a 3 mTorr pressure. In this case, T1 is proximate to the maximum signal intensity at 521 nm. Note the over etch portion of this RIE step begins at T1 and ends at T2 around 73 seconds. Total process time of 78 seconds includes a 5 second He exhaust of the RIE chamber after the over etch step.

According to one embodiment of the present disclosure, etch conditions in the main etch portion comprised of plasma or ions 32p are substantially maintained during the subsequent over etch portion. However, in one preferred embodiment, the flow rate ratio of noble gas/oxidant is increased during the over etch portion to minimize chemical damage to MTJ sidewalls. For example, if a 9:1 noble gas/oxidant flow rate ratio is selected for the main etch portion, the flow rate ratio may be increased to 10:1 or more during over etch by increasing the noble gas content in the gas mixture. In fact, the flow of oxidant may be terminated at the end of the main etch portion such that the over etch portion comprises only noble gas ions and plasma. Furthermore, RF power during the over etch portion may be decreased to 75 Watts or less at both of the upper and lower electrodes to minimize the amount of bottom electrode material that is etched, and redeposited on MTJ sidewall 20.

Figure 5:
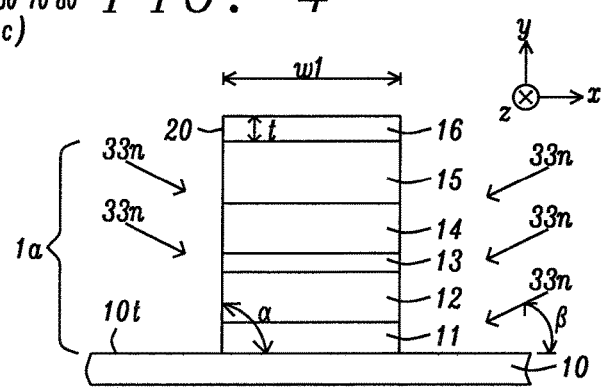
FIG. 5 is a cross-sectional view of the MTJ nanopillar in FIG. 3 showing ions directed at a non-vertical angle during an IBE cleaning step to remove damage or remaining residue on MTJ sidewalls after the etch process in FIG. 3.

According to a second embodiment shown in FIG. 5, the present disclosure encompasses a MTJ etch process flow where the etch process with plasma or ions 32p is followed by an etch step that is an IBE or plasma etch involving plasma or ions 33n wherein the MTJ etch conditions related to noble gas/oxidant flow rate ratio are substantially maintained. However, the ions 33n during an IBE embodiment are directed at an angle β that is between 0° and 90° with respect to substrate 10. When IBE is employed, the etch step with ions 33n is referred to as high pan angle trimming and comprises ions generated from noble gas only, or with a combination of noble gas and one or more oxidants described earlier.

In an alternative embodiment, a plasma etch is performed wherein a plasma 33n is generated with a RF or DC power ≤100 Watts and pure noble gas, or with a combination of noble gas and one or more oxidants described previously. The plasma is directed orthogonal to the substrate (β=90°) in an etch chamber that may be in the same mainframe as employed for the subsequent encapsulation process. In all embodiments, the etch step with plasma or ions 33n is incorporated in the MTJ etch process flow as a cleaning measure to ensure that MTJ sidewalls and substrate top surface 10t are substantially free of residue.

In all of the embodiments, the wafer on which the plurality of MTJ nanopillars is fabricated is typically rotated during an IBE step but is not rotated during a RIE or plasma etch. The IBE embodiment that generates ions 33n comprises a voltage of 50 to 400 V and preferably a beam angle between 40° and 85°. In some embodiments, the beam angle may be swept back and forth between a maximum beam angle and a minimum beam angle.

Figure 6:
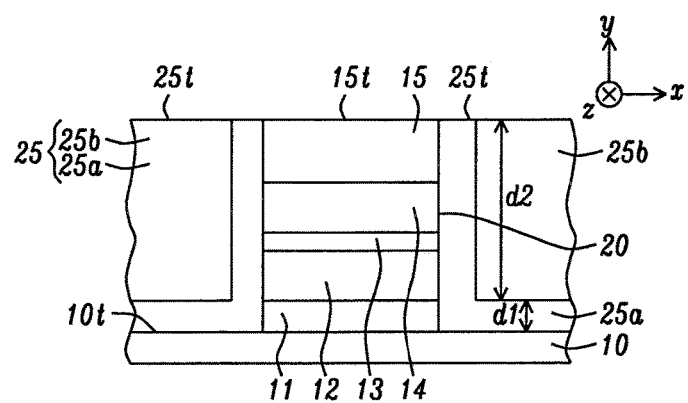
FIG. 6 is a cross-sectional view of the MTJ nanopillar in FIG. 5 following deposition of an encapsulation layer and planarization to electrically isolate the MTJ nanopillar.

Referring to FIG. 6, an encapsulation layer 25 that is comprised of a dielectric material is deposited over the MTJ array after substantially clean sidewalls 20 are formed according to one of the preceding embodiments. The encapsulation layer may comprise one or more layers and fills the gaps between adjacent MTJ nanopillars. In one embodiment, a first encapsulation layer 25a with a thickness d1 from 5 to 250 Angstroms is conformally deposited on the plurality of MTJ nanopillars and on top surface 10t. Then a second encapsulation layer 25b having a thickness d2 up to 2000 Angstroms is deposited on the first encapsulation layer. Each of layers 25a, 25b is one or more of SiN, $SiO_2$, SiON, SiC, TaOx, MgO, $Al_2O_3$, AlN, BN, or the like that is deposited by physical vapor deposition (PVD), chemical vapor deposition (CVD), ion beam deposition (IBD), or atomic layer deposition (ALD). When a plasma etch is employed to generate a plasma 33n for cleaning MTJ sidewalls, the encapsulation process is preferably performed without breaking the vacuum in the process chamber used for the plasma etching.

Thereafter, a chemical mechanical polish (CMP) process or an alternative planarization method is performed to form a top surface 25t on the encapsulation layer that is coplanar with top surface 15t on hard mask 15. In some embodiments, the CMP process removes any DARC or BARC layer 16 remaining after etch steps 32, 33.

Figure 7:
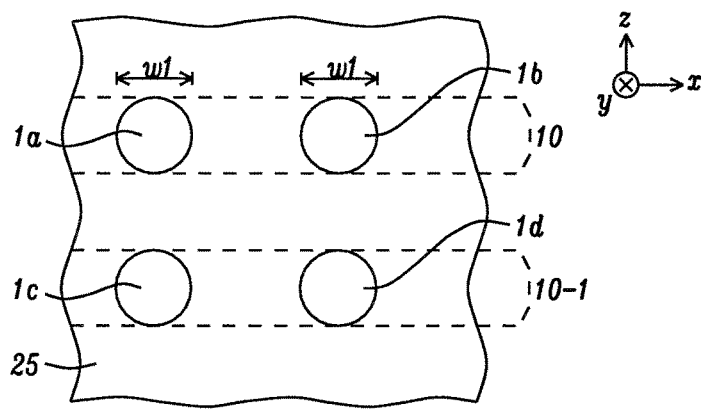
FIG. 7 is a top-down view of a plurality of MTJ nanopillars having a circular shape in an array of rows and columns according to an embodiment of the present disclosure.

Referring to FIG. 7, the plurality of island shapes of the MTJ nanopillars formed by an etch process or process flow of the present disclosure is depicted from a top-down view after the CMP or alternative planarization step. MTJ nanopillar 1a is shown in the same row as MTJ nanopillar 1b, and MTJ nanopillars 1c, 1d are in the same column as MTJ nanopillars 1a and 1b, respectively. As explained previously, the MTJ nanopillars are depicted with a circular shape but may have elliptical shapes in other embodiments. Generally, millions of MTJ nanopillars are formed in an array but only four are illustrated here to simplify the drawing.

Thereafter, a top electrode layer comprised of a plurality of parallel conductive lines (not shown) is formed by a conventional method on the MTJ nanopillars and encapsulation layer 25 as appreciated by those skilled in the art. A first top electrode line may contact a top surface 15t of MTJ nanopillars 1a, 1c while a second top electrode line contacts top surface 15t in MTJ nanopillars 1b, 1d. Conductive lines in the top electrode layer are preferably formed along the z-axis direction that is orthogonal to the conductive lines 10, 10-1 along the x-axis direction in a substructure of the bottom electrode layer.

We have demonstrated the benefits of the combined physical/chemical etch process of the present disclosure with results from an experiment where a series of MTJ nanopillars with various diameters (w1 in FIG. 3 and FIG. 7) were fabricated. Each MTJ stack of layers in all experiments included a MgO tunnel barrier layer between a CoFeB free layer and a CoFeB reference layer, a Ru/Ta (or Ru/TaN) hard mask, and a NiCr seed layer. According to a process described in the first embodiment, the MTJ stack of layers 11-14 (FIG. 2) with an overlying patterned hard mask layer 15 was etched with RIE conditions comprising an $Ar/CH_3OH$ gas mixture, a RF power of 1500 Watts (upper electrode), 1100 Watts (lower electrode), a 15 sccm flow rate for the gas mixture, and a 3 mTorr pressure. The Ar composition in the gas mixture was varied from 100% (reference sample) to 90%, 75%, and 50% for MTJ nanopillars fabricated according to the present disclosure. Accordingly, the Ar flow rate was successively decreased from 15 sccm to 13.5 sccm, 11.25 sccm, and 7.5 sccm, respectively, for the reference sample and 90:10, 75:25, and 50:50 flow rate ratios. Meanwhile, the $CH_3OH$ flow rate was increased from 0 to 1.5 sccm, 3.75 sccm, and 7.5 sccm, respectively, to arrive at 15 sccm total flow rate for the gas mixture in all experiments.

Figure 8:
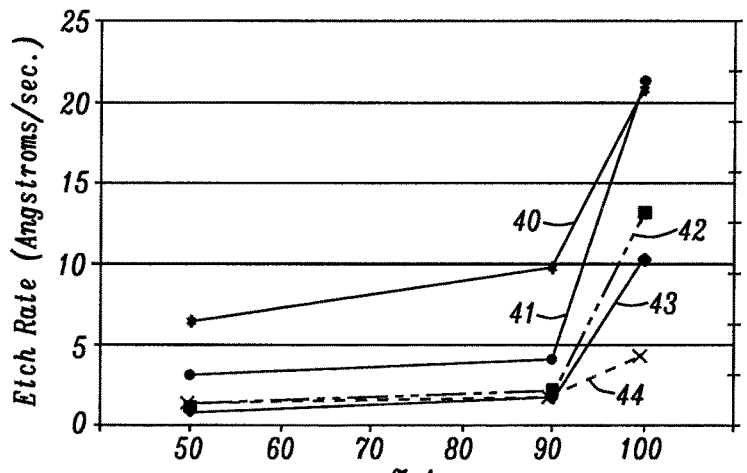
FIG. 8 is a plot of etch rate for various MTJ materials vs. Ar content in the MTJ etch process shown in FIG. 3.

A first set of data listed in Table 1 and depicted in FIG. 8 relates to the observed etch rates for various layers in the MTJ stack. In general, as methanol content increases in the MTJ etch, etch rate shown in Angstroms/second decreases for all MTJ materials. However, there is a greater decrease in etch rate between pure Ar and the 90:10 flow rate ratio than between the 90:10 and 50:50 flow rate ratios for Ru (curve 40), NiCr (curve 41), TaN (curve 42), Ta (curve 43), and CoFeB (curve 44).

TABLE 1

Etch rates in Angstroms/sec. for various MTJ layers as a function of % Ar in $Ar/CH_3OH$ RIE

| MTJ material | 50% Ar | 90% Ar | 100% Ar |
| --- | --- | --- | --- |
| Ta | 0.92 | 1.84 | 10.31 |
| TaN | 1.19 | 2.27 | 13.16 |
| $Co_{20}Fe_{60}B_{20}$ | 1.4 | 1.81 | 4.32 |
| Ru | 6.49 | 9.77 | 20.87 |
| NiCr | 3.21 | 4.12 | 21.34 |

Figure 9:
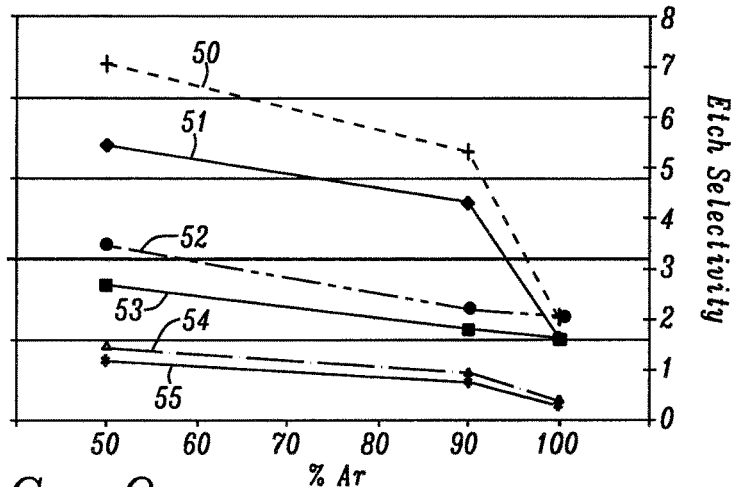
FIG. 9 is a plot of etch rate selectivity between a Ta (or TaN) hard mask and various MTJ layers during the MTJ etch process shown in FIG. 3.

As indicated below, etch rate selectivity of CoFeB, Ru, and NiCr to Ta (Table 2) and illustrated as curves 54, 50, and 52, respectively in FIG. 9, as well as etch rate selectivity of CoFeB, Ru, and NiCr to TaN (Table 3) and shown as curves 55, 51, and 53, respectively in FIG. 9, is substantially improved, and in some cases, by over 100% when incorporating 10% or more of MeOH in the gas mixture for etching. This result is attributed to oxidation of a Ta (or TaN) hard mask layer to TaOx that has a much lower sputter yield than either of Ta or TaN. This means that a thinner hard mask may be advantageously employed when etching with a noble gas/oxidant mixture compared with RIE or IBE based on noble gas only. Although the other MTJ materials also exhibit a slower etch rate in the presence of an oxidant such as methanol, the decrease in sputter yield for Ru, NiCr, and CoFeB is not as significant as for Ta and TaN. Note that the etch rate for MgO is difficult to measure so an etch rate or etch selectivity value is not listed in the tables. As a reference, Mg has an etch rate of about 1.1 Angstroms/second in a 100% $CH_3OH$ etch using the aforementioned RIE conditions.

TABLE 2

Etch selectivity for various MTJ layers relative to Ta as a function of % Ar in Ar/$CH_3OH$ RIE

|  | 50% Ar | 90% Ar | 100% Ar |
|---|---|---|---|
| $Co_{20}Fe_{60}B_{20}$/Ta | 1.52 | 0.98 | 0.42 |
| Ru/Ta | 7.05 | 5.31 | 2.02 |
| NiCr/Ta | 3.49 | 2.24 | 2.07 |

TABLE 3

Etch selectivity for various MTJ layers relative to TaN as a function of % Ar in Ar/$CH_3OH$ RIE

|  | 50% Ar | 90% Ar | 100% Ar |
|---|---|---|---|
| $Co_{20}Fe_{60}B_{20}$/TaN | 1.18 | 0.80 | 0.33 |
| Ru/TaN | 5.45 | 4.30 | 1.59 |
| NiCr/TaN | 2.70 | 1.81 | 1.62 |

In Table 4 and Table 5, respectively, the DRR (magnetoresistive ratio) and coercivity (Hc) results from the aforementioned experiments are shown as normalized values relative to a value of 1.0 for a pure methanol etch. The MTJ etch process included plasma 32p in main etch and over etch portions, and a plasma etch clean comprised of plasma 33n. The Ar/$CH_3OH$ flow rate ratio in the main etch and over etch portions was maintained during the plasma etch clean with plasma 33p. For each combination of Ar and methanol, total gas flow was 15 sccm, the over etch time period was optimized, and the plasma etch cleaning time was studied. The 100% methanol process had 100% over etch (OE) where OE time=main etch time, and a 132 second plasma etch. The etch process comprising a 50:50 Ar/$CH_3OH$ gas flow had 100% OE and a 132 second plasma etch clean step. During the etch process with a 75:25 Ar/$CH_3OH$ flow rate ratio, over etch time was reduced to 58% that of the main etch, and the plasma etch cleaning step was maintained at 132 seconds. Finally, for the etch process comprised of a 90:10 Ar/$CH_3OH$ flow rate ratio, the over etch time was reduced to 40% that of the main etch, and plasma etch cleaning time was reduced to 66 seconds.

TABLE 4

Magnetoresistance ratio (DRR) as a function of % methanol in Ar/$CH_3OH$ RIE

| Normalized DRR | Pure methanol | 50% Ar | 75% Ar | 90% Ar |
|---|---|---|---|---|
| CD = 100 nm | 1 | 1.03 | 1.06 | 1.04 |
| CD = 40 nm | 1 | 1.15 | 1.15 | 1.15 |

TABLE 5

Coercivity (Hc) as a function of % methanol in Ar/$CH_3OH$ RIE

| Normalized Hc | Pure methanol | 50% Ar | 75% Ar | 90% Ar |
|---|---|---|---|---|
| CD = 100 nm | 1 | 1.09 | 1.13 | 1.13 |
| CD = 40 nm | 1 | 1.32 | 1.62 | 1.70 |

We observed that as Ar content in the Ar/$CH_3OH$ gas mixture increased, a smaller over etch percentage and shorter plasma etch cleaning time was required for optimization. Furthermore, DRR and He improved substantially as the Ar content in the Ar/$CH_3OH$ gas mixture increased. In particular, the 75:25 and 90:10 flow rate ratios provided the highest DRR and He values, and the results for 75% and 90% Ar content are essentially overlapping for the various MTJ nanopillar sizes. Note that all measurements were obtained after a $Si_3N_4$-2% MgO encapsulation layer was formed between adjacent MTJ nanopillars, and an annealing step at 400° C. was performed for about 2 hours after wafer fabrication.

While this disclosure has been particularly shown and described with reference to, the preferred embodiment thereof, it will be understood by those skilled in the art that various changes in form and details may be made without departing from the spirit and scope of this disclosure.

We claim:

1. A method of etching a magnetic tunnel junction (MTJ) stack of layers, comprising:

(a) providing a MTJ stack of layers on a first electrode wherein the MTJ stack of layers includes an uppermost hard mask layer, and a first stack of layers comprising a reference layer, a free layer, and a tunnel barrier layer between the reference layer and free layer;

(b) forming a pattern in the hard mask layer with a first etch process that is an ion beam etch (IBE) or a reactive ion etch (RIE) wherein the pattern has a sidewall that extends from a hard mask top surface to a top surface of the first stack of layers; and (c) forming a pattern in the first stack of layers with a sidewall that forms continuous surface with the sidewall in the hard mask layer, and that extends to a top surface of the first electrode, wherein the pattern in the first stack of layers is produced by a second etch process, comprising:

(1) a main etch portion performed in a first process chamber wherein a plasma is generated from a gas mixture comprised of a noble gas and one or more oxidants selected from $CH_3OH$, $C_2H_5OH$, $NH_3$, $N_2O$, $H_2O_2$, $O_2$, $H_2O$, and CO, the gas mixture has a first noble gas content less than 100% and >0%;

(2) an over etch portion performed in the first process chamber immediately after the main etch portion ends at an end point, and wherein a plasma is generated from a noble gas and one or more of the aforementioned oxidants, and with a second noble gas content less than 100% and >0%; and (3) a cleaning step that is an IBE or plasma etch performed in a second process chamber after the over etch portion, wherein a plasma is generated from a gas mixture comprised of a noble gas and one of the aforementioned oxidants in which the noble gas content is greater than 0% and ≤100%.

2. The method of claim 1 wherein the plasma in the main etch portion is generated in a RIE process chamber with a RF power between 600 Watts and 3000 Watts applied to an upper electrode, and a RF power between 400 Watts and 3000 Watts applied to a lower electrode.

3. The method of claim 1 wherein a gas pressure in the first process chamber is less than or equal 3 mTorr, but is sufficient to sustain a plasma.

4. The method of claim 1 wherein the main etch and over etch portions are performed at a temperature between room temperature and 80° C.

5. The method of claim 1 wherein the hard mask layer comprises Ta, TaN, Ti, TiN, or W.

6. The method of claim 1 wherein the cleaning step comprises IBE in which ion beams are directed at the sidewall at an angle between 0° and 90° with respect to a top surface of the first electrode.

7. The method of claim 1 wherein the etched MTJ stack of layers is formed in a magnetoresistive random access memory (MRAM) or a spin torque transfer (STT)-MRAM device.

8. The method of claim 1 wherein the cleaning step is a plasma etch wherein a plasma is generated with a RF or DC power of less than 100 Watts.

9. The method of claim 1 wherein the second noble gas content is greater than the first noble gas content.

10. The method of claim 1 wherein the first stack of layers further comprises a bottommost seed layer comprised of NiCr, and the end point is determined with Optical Emission Spectroscopy by monitoring a signal intensity at a 521 nm spectral line for chromium.

11. A method of forming a memory device comprised of a plurality of magnetic tunnel junction (MTJ) nanopillars, comprising:
(a) providing a MTJ stack of layers on a first electrode wherein the MTJ stack of layers includes an uppermost hard mask layer, and a first stack of layers comprising a reference layer, a free layer, and a tunnel barrier layer between the reference layer and free layer;
(b) forming a pattern comprised of a plurality of islands in the hard mask layer with a first etch process that is an ion beam etch (IBE) or a reactive ion etch (RIE) wherein each island has a sidewall that extends from a hard mask top surface to a top surface of the first stack of layers;
(c) forming a plurality of MTJ nanopillars in the first stack of layers with a second etch process that extends the sidewall in each hard mask layer island to a top surface of the first electrode, the second etch process, comprises:
(1) a main etch portion performed in a first process chamber wherein a plasma is generated from a gas mixture comprised of a noble gas and one or more oxidants selected from $CH_3OH$, $C_2H_5OH$, $NH_3$, $N_2O$, $H_2O_2$, $H_2O$, $O_2$, and CO, the gas mixture has a first noble gas content less than 100% and >0%;
(2) an over etch portion performed in the first process chamber immediately after the main etch portion ends at an end point, and wherein a plasma is generated from a noble gas and one or more of the aforementioned oxidants, and with a second noble gas content less than 100% and >0%; and
(3) a cleaning step that is a plasma etch or an IBE performed in a second process chamber after the over etch portion, wherein a plasma in the plasma etch or ions in the IBE are generated from a gas mixture comprised of a noble gas and one of the aforementioned oxidants in which the noble gas content is greater than 0% and ≤100%; and
(d) depositing an encapsulation layer on the MTJ nanopillars and bottom electrode in the second process chamber after the cleaning step, the encapsulation layer is a dielectric layer that fills gaps between adjacent MTJ nanopillars.

12. The method of claim 11 wherein the plasma in the main etch portion is generated in a RIE process chamber with a RF power between 600 Watts and 3000 Watts applied to an upper electrode, and a RF power between 400 Watts and 3000 Watts applied to a lower electrode.

13. The method of claim 11 wherein a gas pressure in the first process chamber is less than or equal to 3 mTorr but is sufficient to sustain a plasma.

14. The method of claim 11 wherein the main etch and over etch portions are performed at a temperature between room temperature and 80° C.

15. The method of claim 11 wherein the hard mask layer comprises Ta, TaN, Ti, TiN, or W.

16. The method of claim 11 wherein the etched MTJ stack of layers is formed in a magnetoresistive random access memory (MRAM) or a spin torque transfer (STT)-MRAM device.

17. The method of claim 11 wherein the plasma etch in the cleaning step comprises a RF or DC power of less than 100 Watts.

18. The method of claim 11 wherein the second noble gas content is greater than the first noble gas content.

19. The method of claim 11 wherein the cleaning step is the IBE and the ions are directed at an angle between 0° and 90° with respect to the first electrode.

20. The method of claim 11 wherein the first stack of layers further comprises a bottommost seed layer comprised of NiCr, and the end point is determined with Optical Emission Spectroscopy by monitoring a signal intensity at a 521 nm spectral line for chromium.

* * * * *